(12) United States Patent
Chang et al.

(10) Patent No.: US 8,312,624 B1
(45) Date of Patent: Nov. 20, 2012

(54) METHOD FOR MANUFACTURING A HEAT DISSIPATION STRUCTURE OF A PRINTED CIRCUIT BOARD

(75) Inventors: Chien-Wei Chang, Taoyuan (TW); Ting-Hao Lin, Taipei (TW); Ya-Hsiang Chen, Yunlin (TW); De-Hao Lu, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 0 days.

(21) Appl. No.: 13/304,340

(22) Filed: Nov. 24, 2011

(51) Int. Cl.
*H05K 3/02* (2006.01)
(52) U.S. Cl. .............. 29/847; 29/846; 29/852; 216/15; 174/260
(58) Field of Classification Search .............. 29/846, 29/847, 852; 216/15, 17, 18; 174/260, 261, 174/262
See application file for complete search history.

(56) References Cited

U.S. PATENT DOCUMENTS

| | | | |
|---|---|---|---|
| 6,426,468 B1 * | 7/2002 | Utsunomiya et al. | 174/261 |
| 6,476,331 B1 * | 11/2002 | Kim et al. | 174/261 |
| 6,706,564 B2 * | 3/2004 | Kim et al. | 438/125 |
| 6,820,328 B2 * | 11/2004 | Barcley | 29/832 |
| 2008/0052904 A1 * | 3/2008 | Schneider et al. | 29/846 |
| 2010/0103634 A1 * | 4/2010 | Funaya et al. | 361/761 |

* cited by examiner

*Primary Examiner* — Derris Banks
*Assistant Examiner* — Jeffrey T Carley
(74) *Attorney, Agent, or Firm* — Lin & Associates IP, Inc.

(57) ABSTRACT

A method for manufacturing a heat dissipation structure of a printed circuit board includes: forming a barrier layer on the dimple in the first copper plating layer; forming a nickel plating layer; removing the nickel plating layer and the barrier layer on the dimple; forming a second copper plating layer to make the total height of the first copper plating layer and the second copper plating layer in the second opening higher than that of the first copper plating layer in the first opening; filling the dimple in the second copper plating layer with an etching-resistant material; removing the second copper plating layer; removing the nickel plating layer and the etching-resistant material to make the second copper plating layer in the second opening being at the same height as the first copper plating layer in the first opening; and forming the heat dissipation structure by photolithography.

4 Claims, 10 Drawing Sheets

METHOD FOR MANUFACTURING A HEAT DISSIPATION STRUCTURE OF A PRINTED CIRCUIT BOARD

BACKGROUND OF THE INVENTION

1. Field of the Invention

The present invention relates to a method for manufacturing a heat dissipation structure of a printed circuit board, and more particularly to a method for manufacturing a heat dissipation structure of a printed circuit board for improving the filling capability of plating copper, and improving the uneven surface caused by performing the copper plating process for many times using a nickel plating process.

2. The Prior Arts

FIGS. 1A to 1F are cross-sectional views illustrating the steps of a conventional method for manufacturing a heat dissipation structure of a printed circuit board. Referring to FIG. 1A, a printed circuit board 1 is provided. The printed circuit board 1 includes a first substrate 10, two second substrates 15 respectively disposed on the upper and lower surfaces of the first substrate 10, two inner copper layers 21 each disposed between the first substrate 10 and the second substrate 15, and two outer copper layers 23 each disposed on one outer surface of the second substrates 15. Referring to FIG. 1B, a plurality of openings are formed in the upper layers of the printed circuit board 1 to expose a portion of the inner copper layers 21. The openings include at least one first opening 31 and at least one second opening 33. The first opening 31 is smaller than the second opening 33, and the size of the second opening 33 is larger than or equal to 150×100 $\mu m^2$. Referring to FIG. 1C, at least one first copper plating layer 25 is formed on the printed circuit board 1. The first opening 31 is fully filled up with the first copper plating layer 25, but the second opening 33 is not fully filled up with the first copper plating layer 25 such that the first copper plating layer 25 filling in the second opening 33 has a first dimple 40 on its top.

Referring to FIG. 1D, a copper plating layer 60 is formed by performing a copper plating process at least once. The copper plating layer 60 is thick so that the dimple 40 can be fully filled up with the copper plating layer 60. A chemical mechanical planarization process is then performed to planarize the surface of the copper plating layer 60.

Referring to FIGS. 1E and 1F, a patterned dry film 50 is formed on the surface of the copper plating layer 60. After an etching process and a removal of the dry film process, a heat dissipation structure 70 including the first copper bumps 71, the second copper bumps 73, and the copper pads 75 is formed. The heat dissipation structure 70 and the inner copper layers 21 are electrically connected to each other.

In the prior art, because the size of the opening is larger than or equal to the size of 150×100 $\mu m^2$, the opening is not easily to be fully filled up by performing the copper plating process only once, and thereby the copper plating process must be performed for many times in order to fill up the opening. However, there exists an uneven surface problem caused by the interface between the two adjacent copper plating layers when the copper plating process is performed for many times, which results in the variation of the resistance values. The resistance value will be increased for each copper plating process. Therefore, a polishing process is needed in order to meet the specification of the resistance value, but the polishing process is not easily controlled so that the resistance value cannot be standarized.

SUMMARY OF THE INVENTION

In the present invention, a method for manufacturing a heat dissipation structure of a printed circuit board is provided, which is characterized in that: forming a barrier layer on the first copper plating layer; removing the barrier layer except the barrier layer formed on a surface of the first dimple in the first copper plating layer; forming a nickel plating layer on the first copper plating layer and on the barrier layer formed on the surface of the first dimple; removing the nickel plating layer formed on the barrier layer on the surface of the first dimple, followed by removing the barrier layer formed on the surface of the first dimple; forming a second copper plating layer on the nickel plating layer and on the surface of the first dimple to make a total height of the first copper plating layer and the second copper plating layer in the second opening higher than a height of the first copper plating layer in the first opening, the second copper plating layer in the second opening having a second dimple; filling the second dimple with an etching-resistant material; removing the second copper plating layer uncovered by the etching-resistant material; removing the nickel plating layer and the etching-resistant material to make a top surface of the second copper plating layer filling in the second opening being at the same height as a top surface of the first copper plating layer filling in the first opening; forming a patterned dry film on the top surface of the first copper plating layer and on the top surface of the second copper plating layer; and etching the top layer of the printed circuit board uncovered by the photoresist and removing the dry film to form a heat dissipation structure layer comprising a plurality of first copper bumps, a plurality of second copper bumps, and a plurality of copper pads.

In the present invention, when the substrate has the openings with different sizes and the copper cannot be plated in the openings once, the nickel plating layer is formed as a barrier layer to avoid the uneven surface caused by performing the copper plating process for many times. Furthermore, by sandwiching the nickel plating layer between the copper plating layers, the resistance value of the plated copper layer can be easily controlled, and thereby the problems in the prior art can be solved.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constituted a part of this specification. The drawings illustrate an embodiment of the invention and, together with the description, serve to explain the principles of the invention.

Figure 1A:
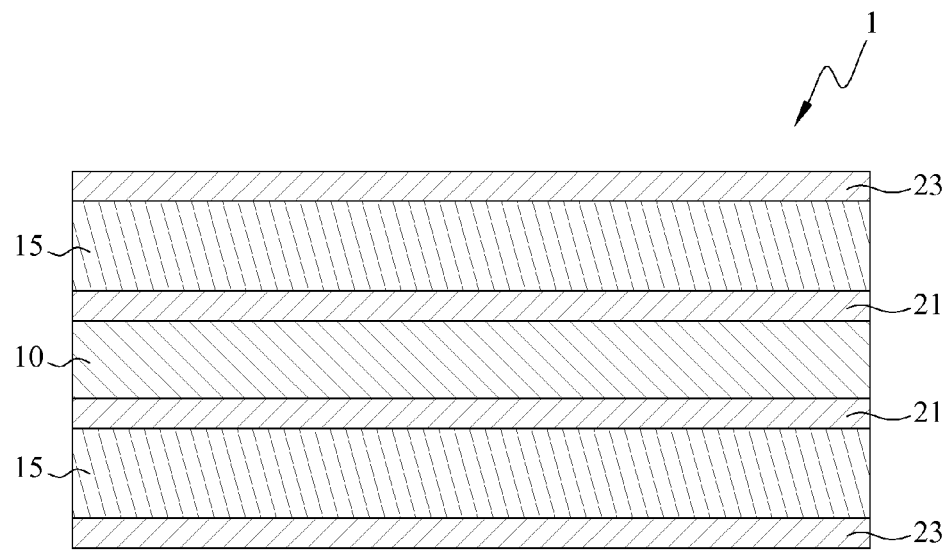
FIGS. 1A to 1F are cross-sectional views illustrating the steps of a conventional method for manufacturing a heat dissipation structure of a printed circuit board.
Figure 1B:
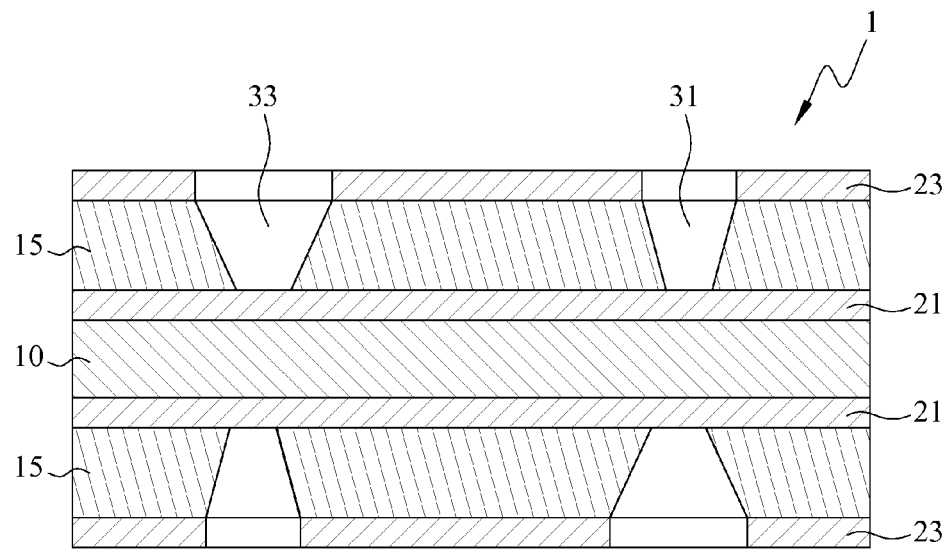
Figure 1C:
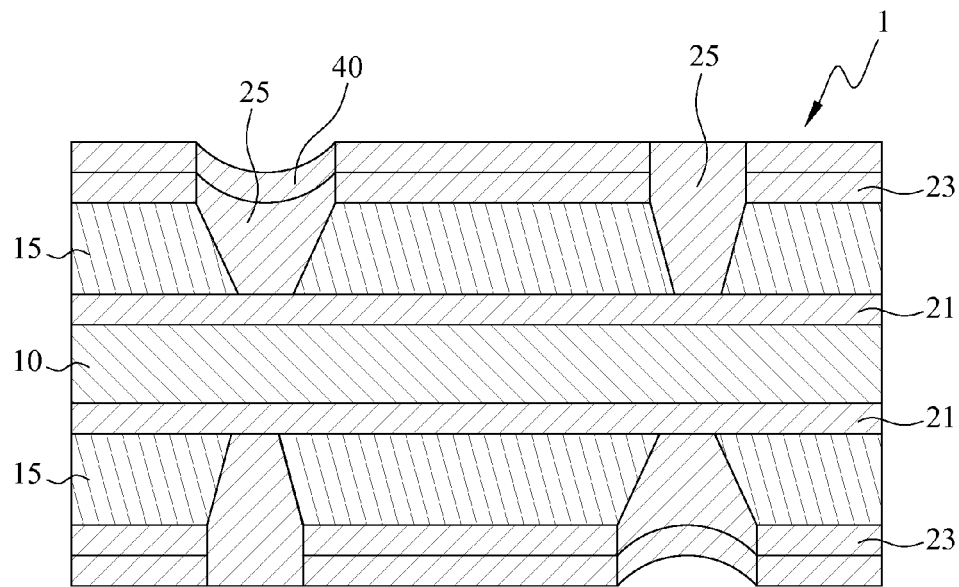
Figure 1D:
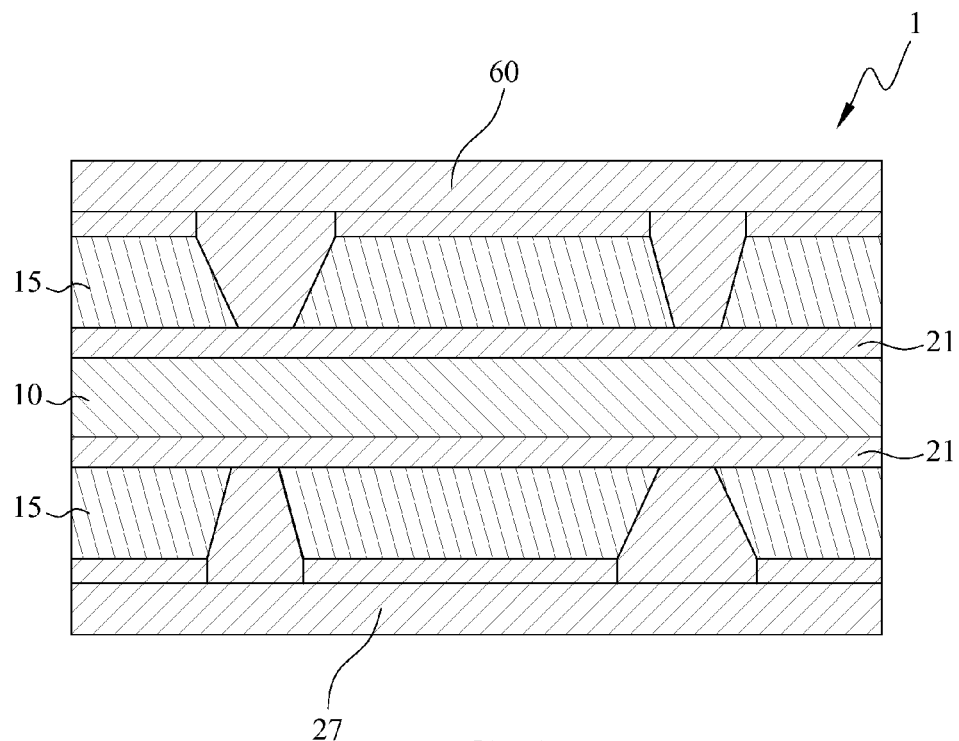
Figure 1E:
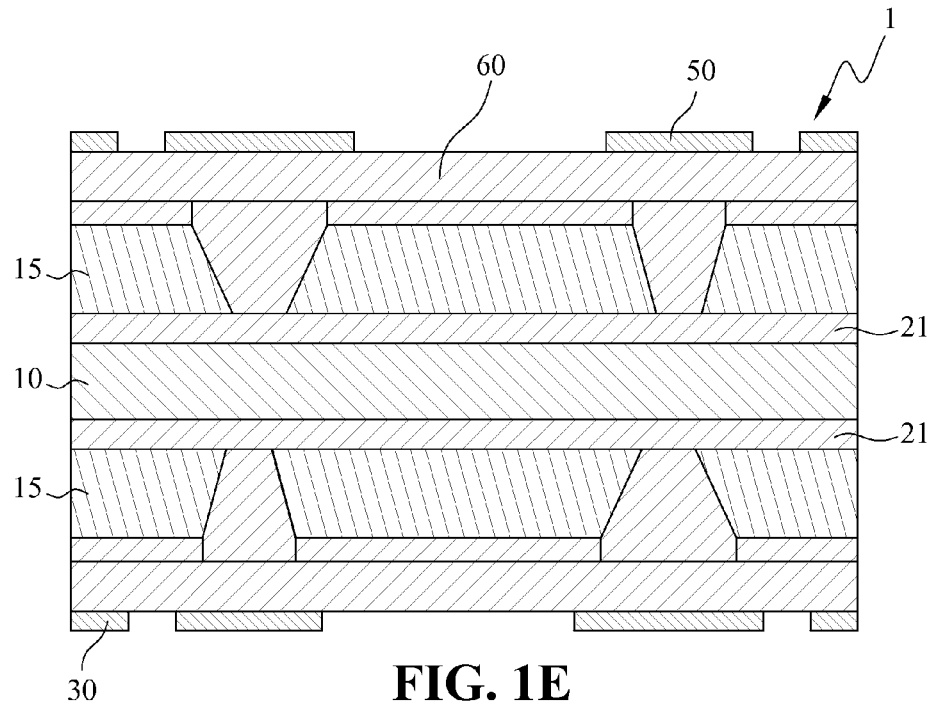
Figure 1F:
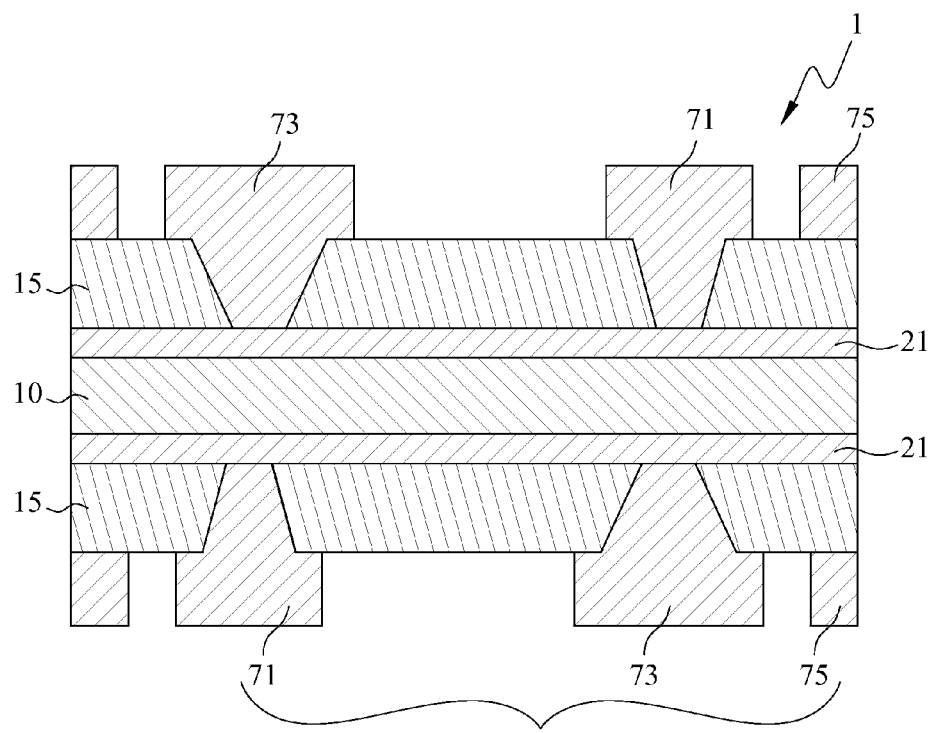
Figure 2:
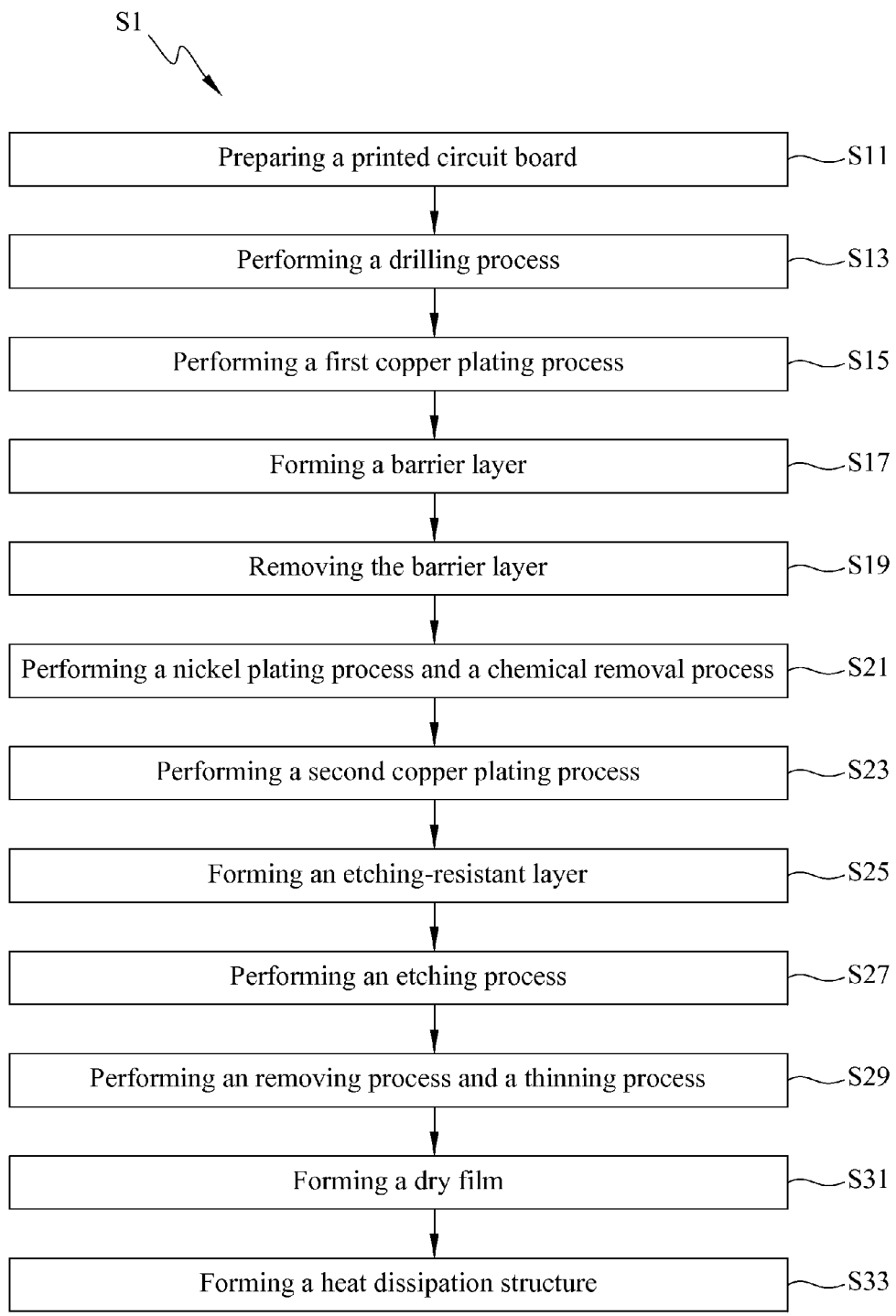
FIG. 2 is a flowchart showing the steps of the method for manufacturing a heat dissipation structure of a printed circuit board according to the present invention.

FIG. 2 is a flowchart showing the steps of the method for manufacturing a heat dissipation structure of a printed circuit board according to the present invention. FIGS. 3A to 3L are cross-sectional views illustrating the steps of the method for manufacturing a heat dissipation structure of a printed circuit board according to one embodiment of the present invention. Referring to FIG. 2, the method for manufacturing the heat dissipation structure of the printed circuit board of the present invention (S1) comprises: a step of preparing a printed circuit board (S11), a step of performing a drilling process (S13), a step of performing a first copper plating process (S15), a step of forming a barrier layer (S17), a step of removing the barrier layer (S19), a step of performing a nickel plating process and a chemical removal process (S21), a step of performing a second copper plating process (S23), a step of forming an etching-resistant layer (S25), a step of performing an etching process (S27), a step of performing an removing process and a thinning process (S29), a step of forming a dry film (S31), and a step of forming a heat dissipation structure (S33).

Figure 3A:
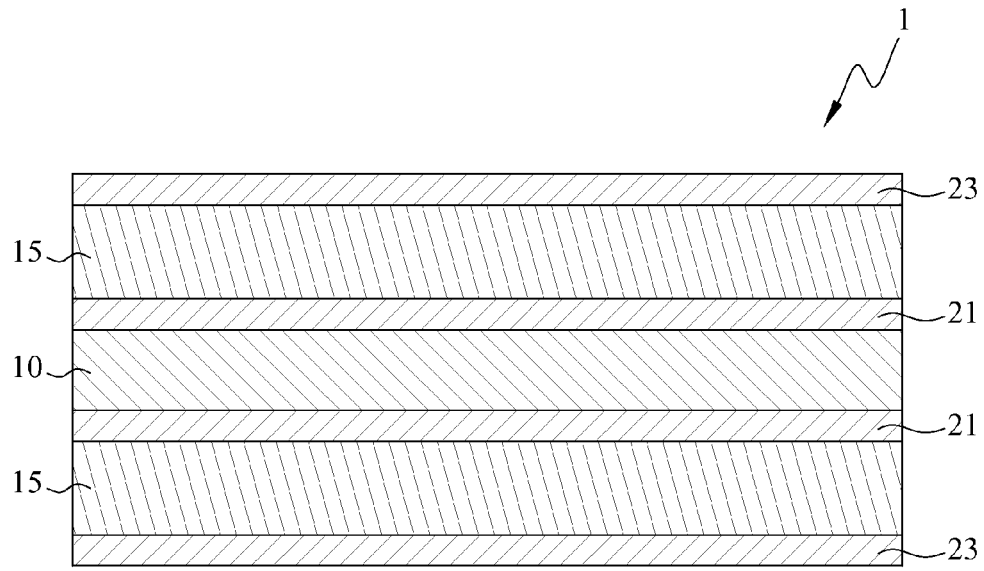
FIGS. 3A to 3L are cross-sectional views illustrating the steps of the method for manufacturing a heat dissipation structure of a printed circuit board according to one embodiment of the present invention.
Figure 3B:
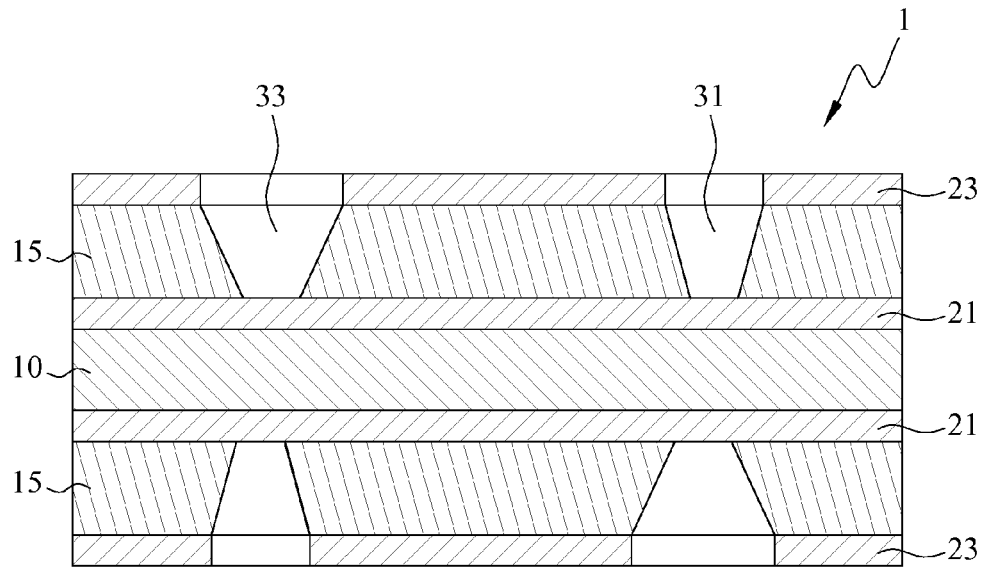
Figure 3C:
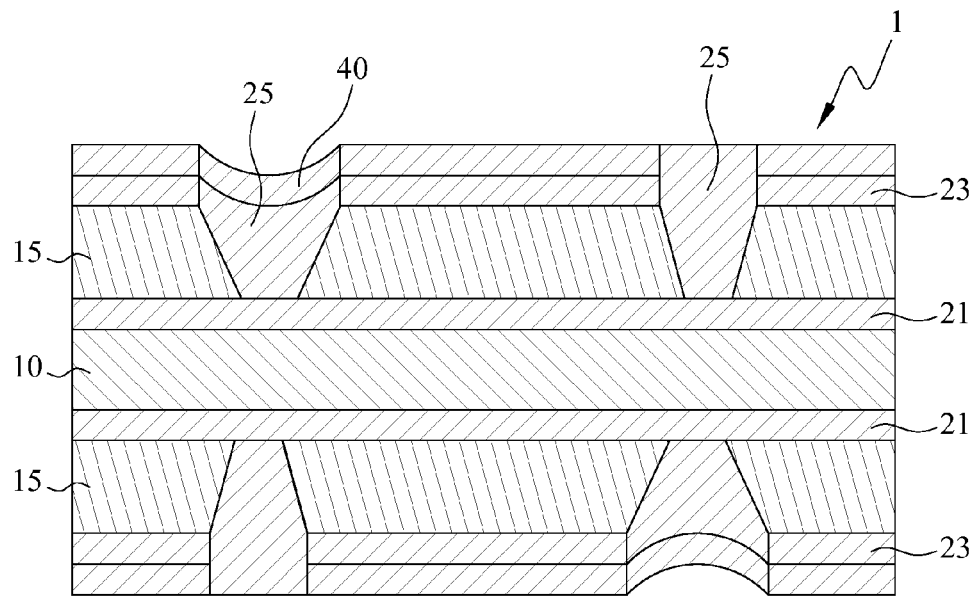

Referring to FIG. 3A, in the step of preparing a printed circuit board (S11), a printed circuit board 1 is provided. The printed circuit board 1 includes a first substrate 10, two second substrates 15 respectively disposed on the upper and lower surfaces of the first substrate 10, two inner copper layers 21 each disposed between the first substrate 10 and the second substrate 15, and two outer copper layers 23 each disposed on one outer surface of the second substrates 15. The printed circuit board 1 of the present invention is a three layer printed circuit board, and however, this is just an example and should not be seen as to limit the scope of the present invention. Referring to FIG. 3B, in the step of performing a drilling process (S13), a plurality of openings are formed in the upper layers of the printed circuit board 1 to expose a portion of the inner copper layers 21. The openings include at least one first opening 31 and at least one second opening 33. The first opening 31 is smaller than the second opening 33, and the size of the second opening 33 is larger than or equal to 150×100 $\mu m^2$. Referring to FIG. 3C, in the step of performing a first copper plating process (S15), at least one first copper plating layer 25 is formed on the printed circuit board 1. The first opening 31 is fully filled up with the first copper plating layer 25, but the second opening 33 is not fully filled up with the first copper plating layer 25 such that the first copper plating layer 25 filling in the second opening 33 has a first dimple 40 on its top.

Figure 3D:
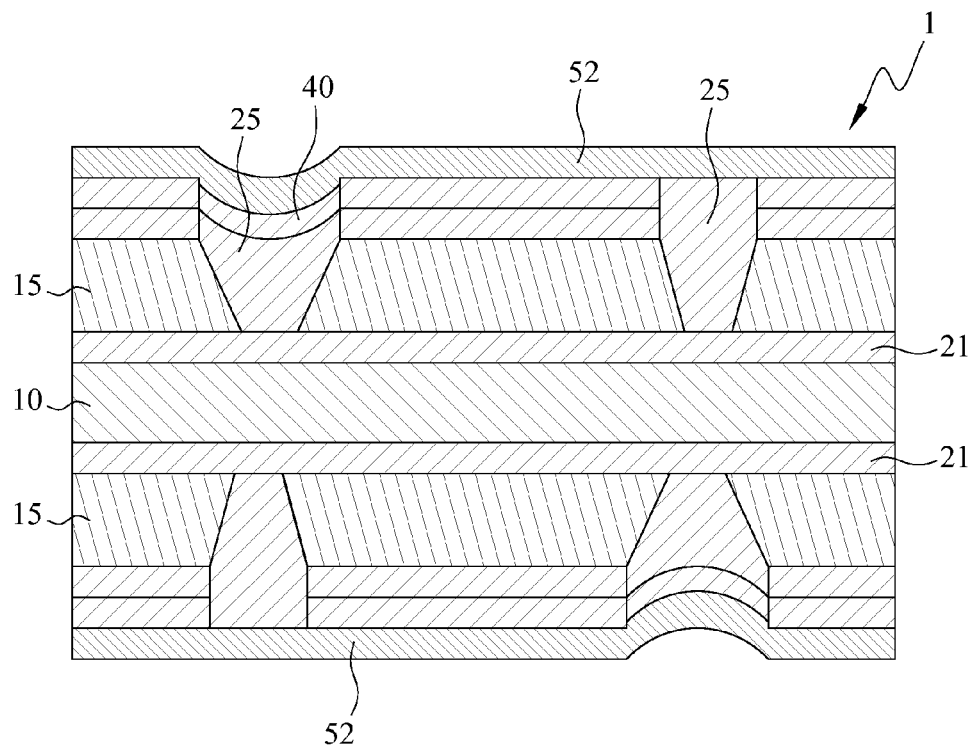
Figure 3E:
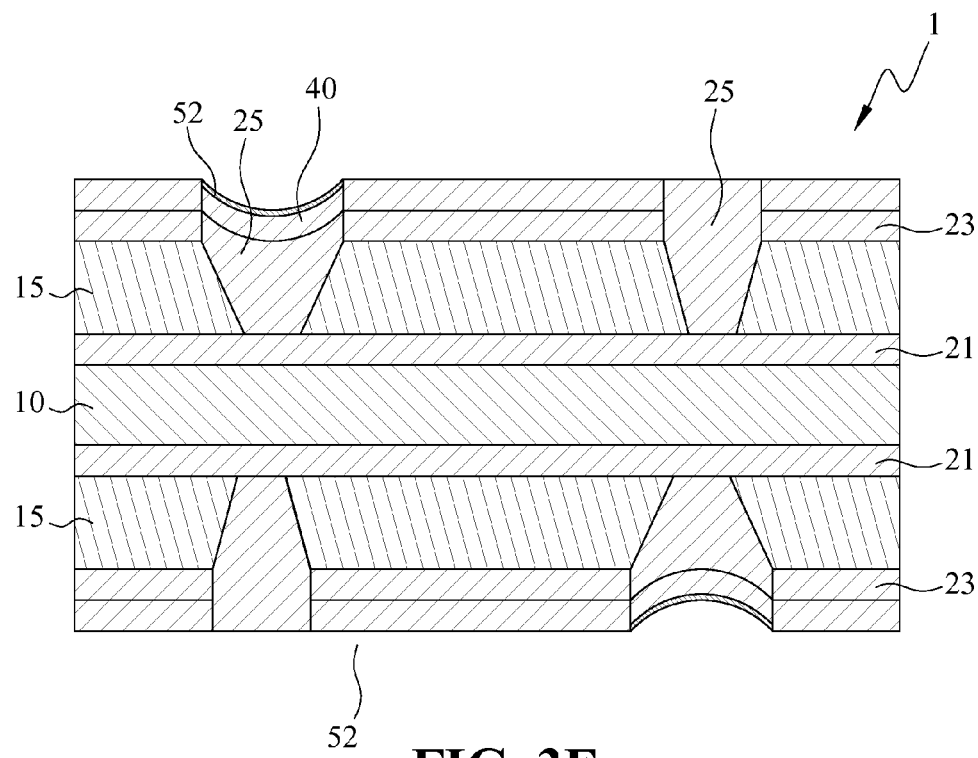
Figure 3F:
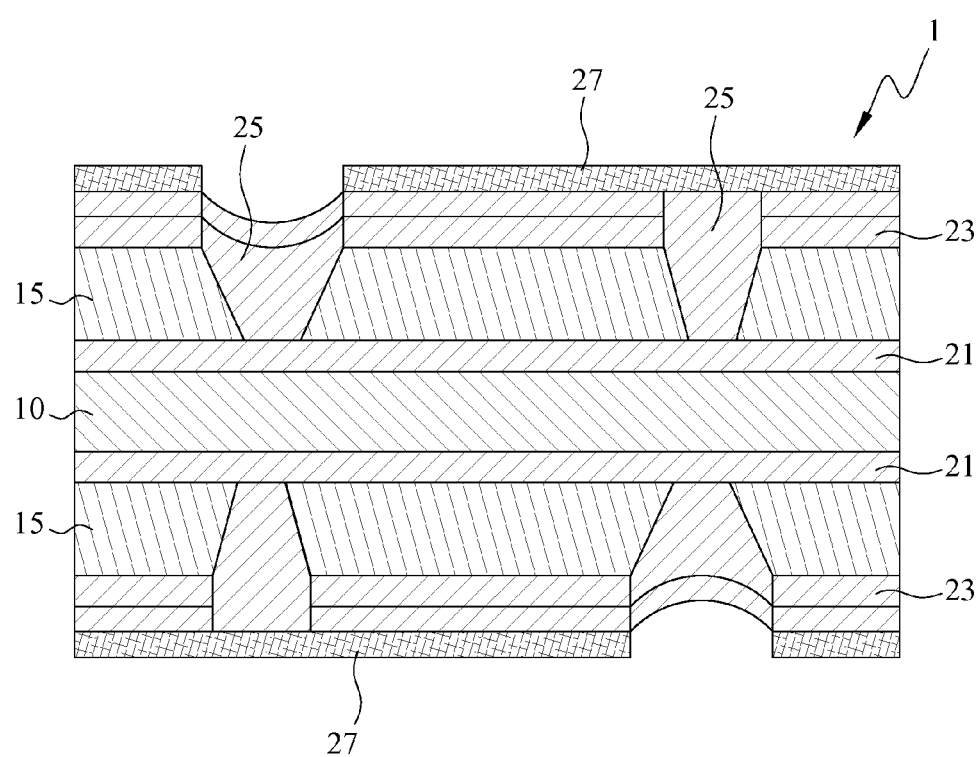

Referring to FIGS. 3D and 3E, in the step of forming a barrier layer (S17), a barrier layer 52 is formed on the first copper plating layer 25. In the step of removing the barrier layer (S19), the barrier layer 52 is removed by a chemical mechanical planarization process, but the barrier layer 52 formed on the surface of the first dimple 40 is remained. Referring to FIG. 3F, in the step of performing a nickel plating process and a chemical removal process (S21), a nickel plating layer 27 is formed on the first copper plating layer 25 and the barrier layer 52, and then the remaining barrier layer 52 formed on the surface of the first dimple 40 and the nickel plating layer 27 formed on the remaining barrier layer 52 on the surface of the first dimple 40 are removed by a chemical removal process so that there is no nickel plating layer 27 above the first dimple 40.

Figure 3G:
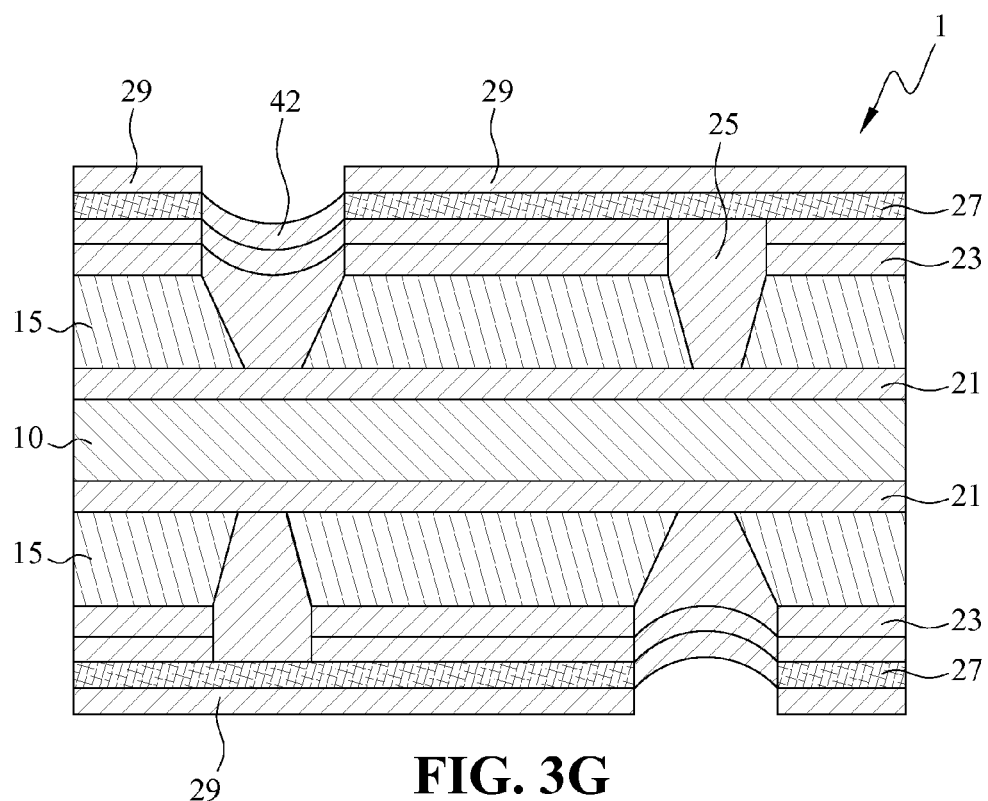
Figure 3H:
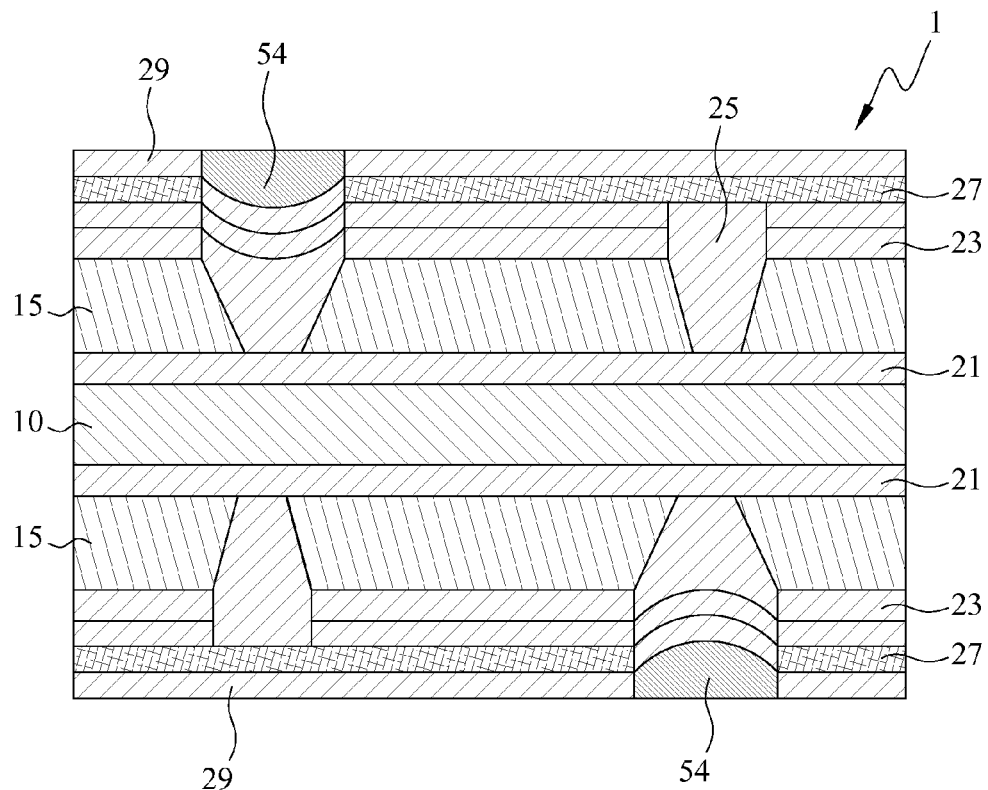
Figure 3I:
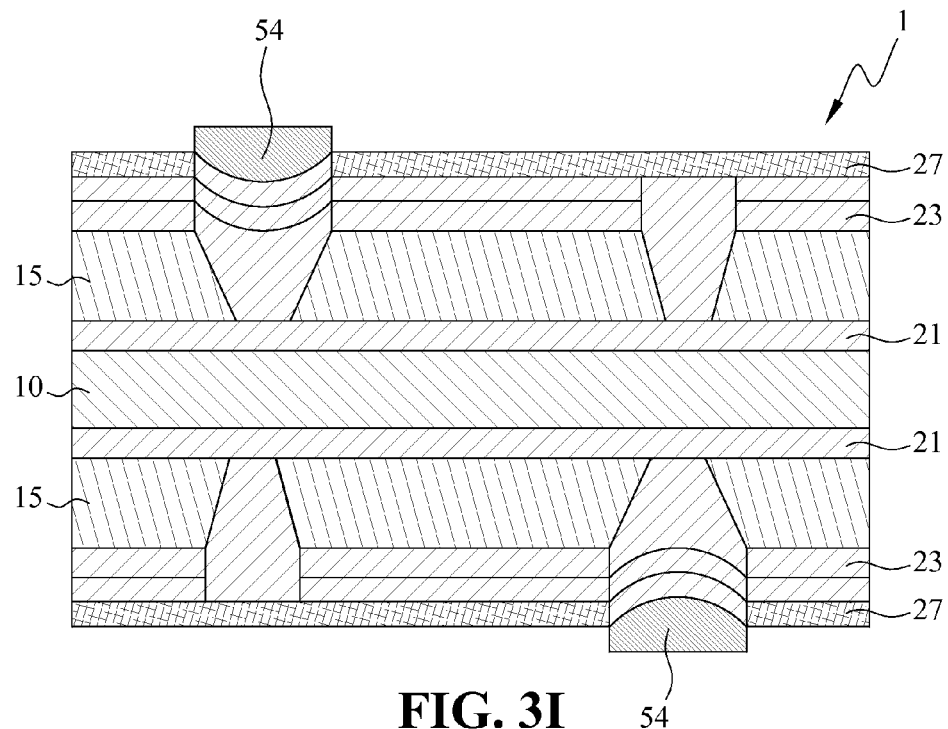
Figure 3J:
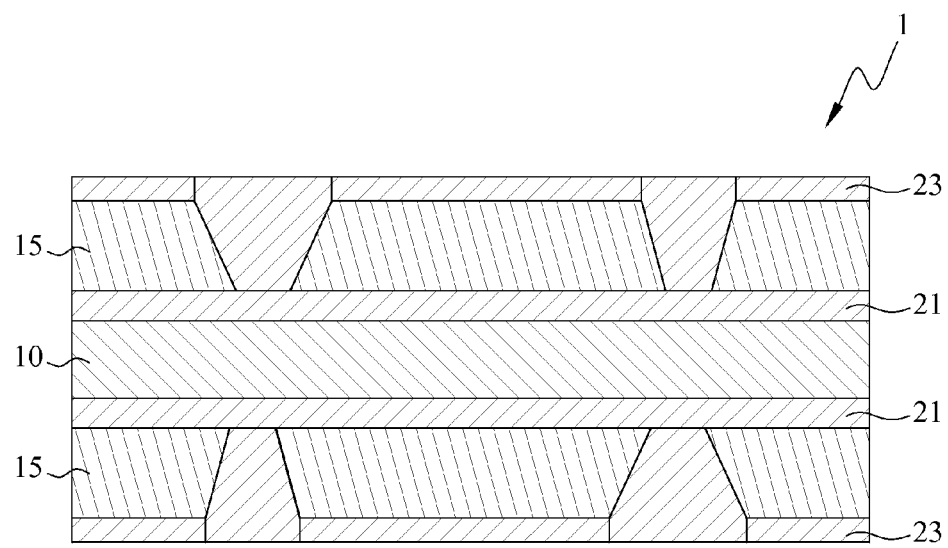

Referring to FIG. 3G, in the step of performing a second copper plating process (S23), a second copper plating layer 29 is formed on the nickel plating layer 27 and on the first copper plating layer 25 formed on the surface of the first dimple 40 to make the total height of the first copper plating layer 25 and the second copper plating layer 29 in the second opening 33 higher than the height of the first copper plating layer 25 in the first opening 31. The second copper plating layer 29 in the second opening 33 has a second dimple 42. Referring to FIG. 3H, in the step of forming an etching-resistant layer (S25), the second dimple 42 is filled with an etching-resistant material 54. In the step of performing an etching process (S27), the second copper plating layer 29 is removed except the portion of the second copper plating layer 29 which is covered by the etching-resistant material 54. Referring to FIG. 3I, in the step of performing an removing process and a thinning process (S29), the nickel plating layer 27 and the etching-resistant material 54 are removed by a chemical mechanical planarization process or a chemical stripping process. Because the height of the second copper plating layer 29 filling in the second opening 33 is higher than the height of the first copper plating layer 25 in the first opening 31, when the chemical mechanical planarization process is performed, a portion of the second copper plating layer 29 is removed, and after that the top surface of the second copper plating layer 29 filling in the second opening 33 will be at the same height as the top surface of the first copper plating layer 25 in the first opening 31, as shown in FIG. 3J. Further, the thickness of the first copper plating layer 25 can be thinned, which depends on the need of the required resistance value.

Figure 3K:
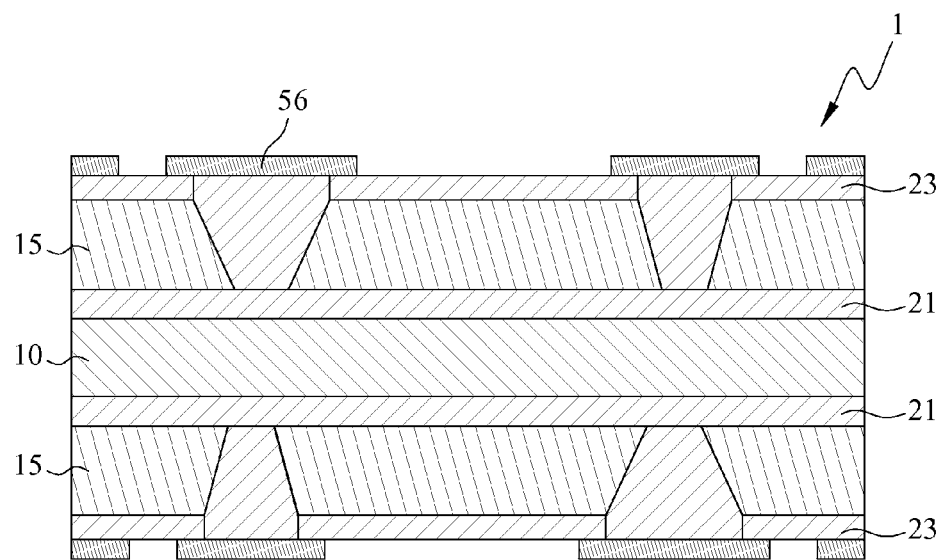
Figure 3L:
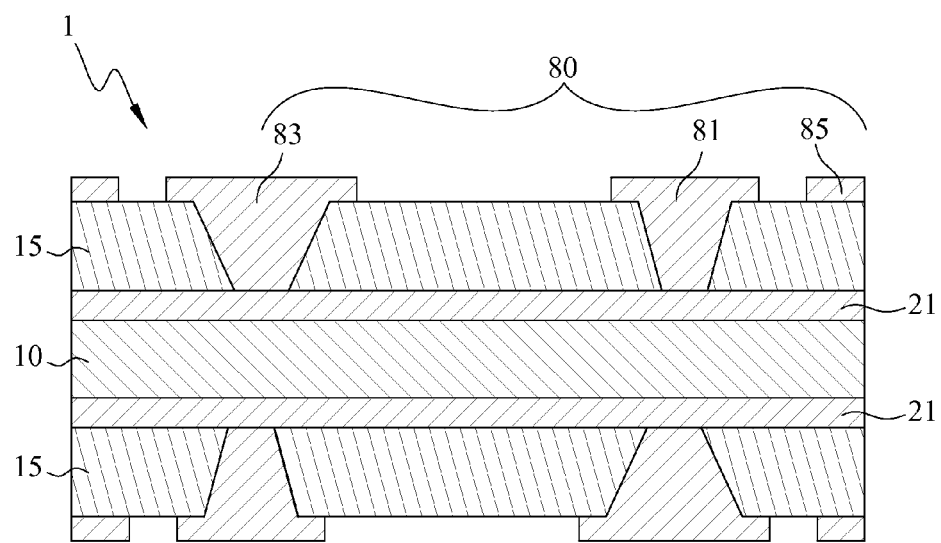

Referring to FIG. 3K, in the step of forming a dry film (S31), a patterned dry film or a photoresist 56 is formed on the surface of the two outer copper layers 23, the first copper plating layer 25 and the second copper plating layer 29. Referring to FIG. 3L, in the step of forming a heat dissipation structure (S33), after the two outer copper layers 23 uncovered by the photoresist 56 are etched and the dry film is removed, a heat dissipation structure 80 including a first copper bump 81, a second copper bump 83, and a copper pad 85 is formed on the surface of the printed circuit board 1. The heat dissipation structure 80 and the inner copper layers 21 are electrically connected to each other.

In the present invention, when the substrate has the openings with different sizes and the copper cannot be plated in the openings once, the nickel plating layer is formed as a barrier layer to avoid the uneven surface caused by performing the copper plating process for many times. Furthermore, by sandwiching the nickel plating layer between the copper plating layers, the resistance value of the plated copper layer can be easily controlled, and thereby the problems in the prior art can be solved.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for manufacturing a heat dissipation structure of a printed circuit board, comprising:
    providing a printed circuit board;
    forming a plurality of openings in upper layers of the printed circuit board by a drilling process, the plurality of openings exposing a portion of at least one inner copper layer on the printed circuit board, the plurality of openings comprising at least one first opening and at least one second opening, the at least one the first opening being smaller than the at least one the second opening, a size of the at least one second opening being larger than or equal to 150×100 $\mu m^2$;
    forming at least one first copper plating layer on a top layer of the printed circuit board, the first opening being filled up with the at least one first copper plating layer, the second opening being not fully filled up with the first copper plating layer, the first copper plating layer filled in the at least one second opening having a first dimple;

forming a barrier layer on the first copper plating layer;

removing the barrier layer except the barrier layer formed on a surface of the first dimple;

forming a nickel plating layer on the first copper plating layer and on the barrier layer formed on the surface of the first dimple;

removing the nickel plating layer formed on the barrier layer on the surface of the first dimple, followed by removing the barrier layer formed on the surface of the first dimple;

forming a second copper plating layer on the nickel plating layer and on the surface of the first dimple to make a total height of the first copper plating layer and the second copper plating layer in the second opening higher than a height of the first copper plating layer in the first opening, the second copper plating layer in the second opening having a second dimple;

filling the second dimple with an etching-resistant material;

removing the second copper plating layer uncovered by the etching-resistant material;

removing the nickel plating layer and the etching-resistant material to make a top surface of the second copper plating layer filling in the second opening being at the same height as a top surface of the first copper plating layer filling in the first opening;

forming a patterned dry film on the top surface of the first copper plating layer and on the top surface of the second copper plating layer; and etching the top layer of the printed circuit board uncovered by the photoresist and removing the dry film to form a heat dissipation structure layer comprising a plurality of first copper bumps, a plurality of second copper bumps, and a plurality of copper pads.

2. The method of claim 1, further comprising thinning a thickness of the first copper plating layer.

3. The method of claim 1, wherein the heat dissipation structure layer and the at least one inner copper layer are electrically connected to each other.

4. The method of claim 1, wherein the printed circuit board comprises:

a first substrate;

two second substrates respectively disposed on an upper and a lower surfaces of the first substrate;

the two inner copper layers each disposed between the first substrate and the second substrate; and two outer copper layers each disposed on one outer surface of the second substrates.

* * * * *